(12) United States Patent
Kurahashi et al.

(10) Patent No.: US 11,265,007 B2
(45) Date of Patent: Mar. 1, 2022

(54) CAPACITOR VOLTAGE STACKING PIPELINE ANALOG-TO-DIGITAL CONVERTER (ADC)

(71) Applicant: HEWLETT PACKARD ENTERPRISE DEVELOPMENT LP, Houston, TX (US)

(72) Inventors: Peter Kurahashi, Ft. Collins, CO (US); Dacheng Zhou, Ft. Collins, CO (US); Michael James Marshall, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/938,856

(22) Filed: Jul. 24, 2020

(65) Prior Publication Data
US 2022/0029632 A1 Jan. 27, 2022

(51) Int. Cl.
*H03M 1/16* (2006.01)
*H03M 1/12* (2006.01)

(52) U.S. Cl.
CPC ......... *H03M 1/167* (2013.01); *H03M 1/1245* (2013.01)

(58) Field of Classification Search
CPC ........................... H03M 1/167; H03M 1/1245
See application file for complete search history.

(56) References Cited

U.S. PATENT DOCUMENTS

| | | | |
|---|---|---|---|
| 6,822,601 B1* | 11/2004 | Liu | H03M 1/1004 341/120 |
| 8,451,160 B1* | 5/2013 | Zhou | H03M 1/1215 341/161 |
| 8,604,962 B1* | 12/2013 | Lewyn | H03M 1/0863 341/162 |
| 9,112,523 B1* | 8/2015 | Ford | H03M 1/0609 |
| 10,917,105 B1* | 2/2021 | Ayman | H03M 1/125 |
| 2005/0114426 A1* | 5/2005 | Lin | H04L 27/01 708/800 |
| 2011/0084860 A1* | 4/2011 | Murden | H03M 1/1215 341/110 |
| 2014/0055295 A1* | 2/2014 | Hernes | H03M 1/1061 341/161 |

(Continued)

*Primary Examiner* — Lam T Mai
(74) *Attorney, Agent, or Firm* — Park, Vaughan, Fleming & Dowler LLP

(57) ABSTRACT

Systems and methods are provided for a pipelined analog-to-digital converter (ADC) circuit. The pipelined ADC circuit comprises a plurality of stages. Each stage comprises a differential input configured to receive a differential signal, a multiplying digital-to-analog converter (MDAC) electrically coupled to the input configured to stack voltages of a set of capacitors; a comparator electrically disposed after the MDAC to compare the differential voltages; and a source follower buffer electrically coupled to the first signal line and the second signal line and electrically disposed after the comparator, wherein the MDAC is configured to amplify an output voltage using passive multiplication; and an alignment circuit communicatively connected to a digital bit output of each stage of the plurality of stages, wherein the alignment circuit is configured to delay a digital bit output of each stage for one or more clock cycles and output a digitized representation of a sampled differential signal.

20 Claims, 9 Drawing Sheets

(56) References Cited

U.S. PATENT DOCUMENTS

| | | | | |
|---|---|---|---|---|
| 2014/0176358 A1* | 6/2014 | Yang | ................ | H03F 3/005 |
| | | | | 341/161 |
| 2015/0137854 A1* | 5/2015 | Li | ................ | H03M 1/1255 |
| | | | | 327/93 |
| 2015/0263745 A1* | 9/2015 | Keramat | ............ | H03M 1/70 |
| | | | | 341/144 |
| 2016/0182075 A1* | 6/2016 | Devarajan | ......... | H03M 1/128 |
| | | | | 341/120 |

* cited by examiner

US 11,265,007 B2

CAPACITOR VOLTAGE STACKING PIPELINE ANALOG-TO-DIGITAL CONVERTER (ADC)

DESCRIPTION OF RELATED ART

As semiconductor chips continue to decrease in size and bandwidth demands increase, the effects of noise, sensitivity, signal integrity, and skew, to name a few, having a greater impact on performance. Generally, one or more serializer/deserializers (SerDes) are used to transfer data and word align the bits at the destination. A SerDes is traditionally an analog-based solution. To convert the analog signal into the digital domain, a successive approximation register (SAR) analog-to-digital converter (ADC) is generally used, which performs a binary search based on charges across test capacitors. The SAR circuit serves as a sub-ADC assembly within the overall ADC device.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
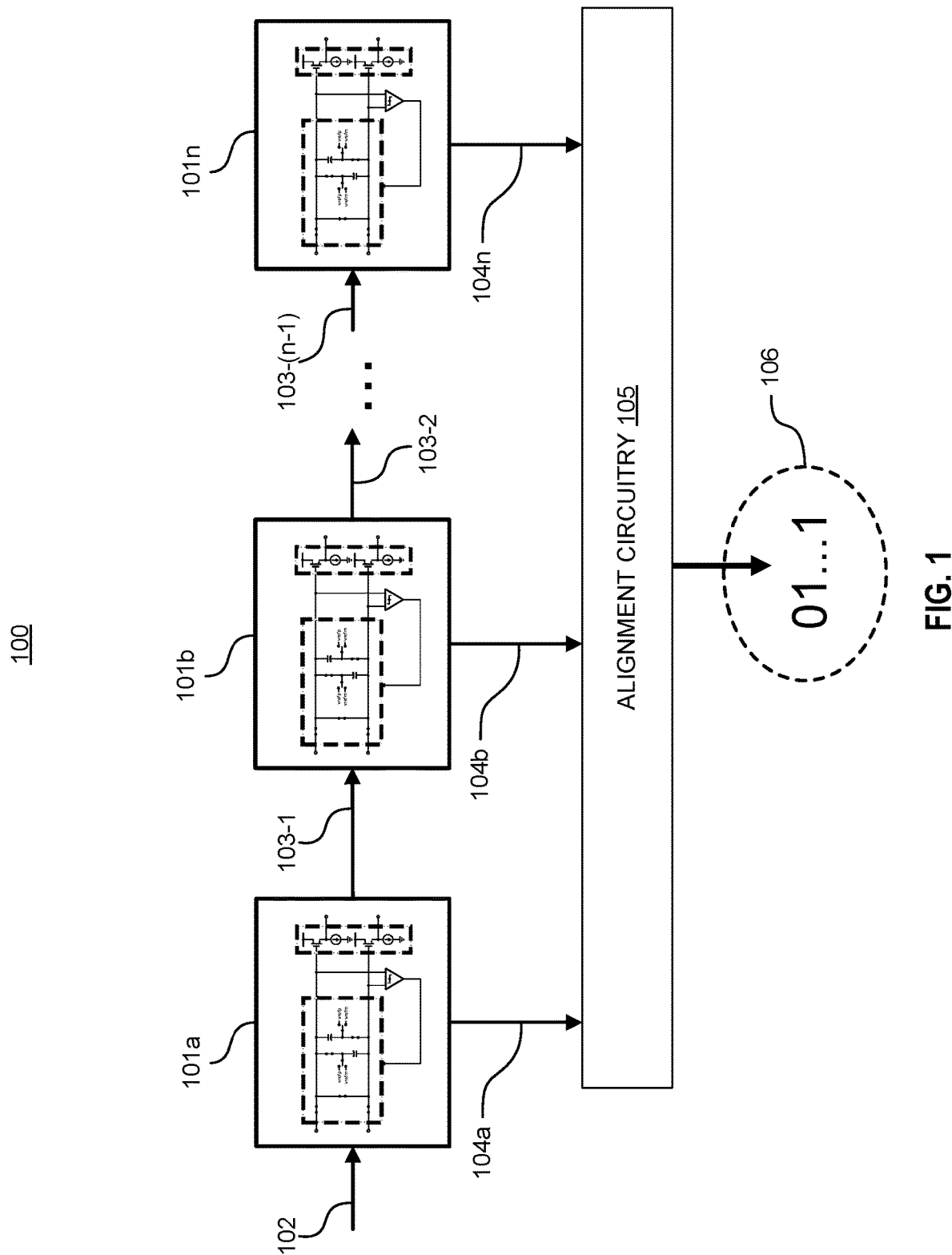
FIG. 1 illustrates an example pipelined ADC circuit in accordance with embodiments of the technology disclosed herein.

The figures are not exhaustive and do not limit the present disclosure to the precise form disclosed.

DETAILED DESCRIPTION

High-speed ADCs are important building blocks in current and future SerDes links. As the desired speed at which computations are to occur increases, the current SAR ADC-based approach quickly becomes a bottleneck. In a SAR ADC, only a single bit is converted during each cycle of the sub-ADC circuit, meaning that determining the digital representation of the analog signal requires a plurality of clock cycles. For example, if you want 8-bits of resolution, you must run 8 cycles of the binary search decision. Moreover, there is no gain in the system because the capacitor size is being reduced through each cycle, meaning that the noise of the comparator serves as a limiting factor on the noise performance of the device. Therefore, the comparator noise characteristics tend to be a determining factor in the overall circuit design.

Pipelining is one approach to increase the overall throughput of ADCs. As the name suggests, a pipelined sub-ADC assemblies comprise a plurality of stages, each connected such that the output analog signal of one serves as the input for the next stage. The cascaded stages tend to be low resolution, for example 1-bit resolution stages. For higher speed applications pipelining can provide higher speeds and higher bandwidth. Within the pipeline approach, the residue from the previous stage is gained up the residue to enable the same physical stage hardware to be used, and the gain reduces the impact of noise on the latter stages (unlike in SAR approaches, where the signal is getting smaller and smaller). Between each stage, the gain is generally added using a switched capacitor-based approach, such as a switched capacitor multiplying digital-to-analog converter (MDAC). The charge is sampled onto a capacitor, which is then pushed into the virtual ground of an amplifier setup in an integrator fashion. Although the capacitors can be matched very well to get accurate gain (i.e., minimize gain error), switched capacitor MDACs are lower speed and not generally well-suited for high-speed ADC implementations.

In some high-speed ADCs, a current-mode logic (CML) gain stage is generally used. CML gain stages provide some gain using a common source amplifier, which is tuned to obtain the desired performance. CML stages have less accuracy than switched capacitor based approaches, but are more applicable for high-speed implementations. However, the CML gains stages have high output impedance, requiring a high current input in order to get the bandwidth high and drive the signal, which requires a lot of power at high speeds. Moreover, the gain is not easily controlled for accuracy, making it more difficult to obtain the desired gain value. CML gain stages cannot handle high input swings because of reduced performance from non-linearity. This prohibits their use in full pipeline architectures which have high signal swing at the input and output of each pipeline stage. To overcome this limitation, previous designs have used a hybrid SAR/pipeline architecture where the SAR reduces the input voltage to the pipeline stage. The inclusion of the SAR stage limits the overall hybrid architecture conversion rate.

Embodiments of the present disclosure provide a pipeline-based ADC and a method of operating the same. As discussed in greater detail below, the technology disclosed provides an analog-to-digital converter (ADC) pipeline circuit comprising a plurality of stages configured to enable use of a pipeline architecture in a high-speed implementation with a fast conversion rate. In various embodiments, each ADC stage in the ADC pipeline comprises a differential input configured to receive a differential signal comprising a positive voltage signal on a first path and a negative voltage signal on a second path; a multiplying digital-to-analog converter (MDAC) electrically coupled to the input configured to stack voltages of a set of capacitors; a comparator electrically coupled to the first path and the second path and electrically disposed after the MDAC, a first input of the comparator connected to the first path and a second input of the comparator connected to the second path; and a source follower buffer electrically coupled to the first signal line and the second signal line and electrically disposed after the comparator, wherein the MDAC is configured to amplify an output voltage using passive multiplication. In various embodiments, the ADC pipeline circuit can comprise a plurality of ADC stages, wherein the number of stages can equal the bit resolution of the ADC sub-circuit in some embodiments or can be greater than the bit resolution.

FIG. 1 illustrates an example pipelined ADC circuit 100 in accordance with embodiments of the technology disclosed herein. The pipelined ADC circuit 100 is provided for illustrative purposes only and should not be interpreted as limiting the scope of the technology to only the depicted embodiment. In various embodiments, the pipelined ADC circuit 100 can comprise a sub-ADC circuit within an ADC device, while in other embodiments the pipelined ADC circuit 100 can comprise the ADC device. The example pipelined ADC circuit 100 is applicable for both non-time-interleaved ADC implementations, time-interleaved sub-ADCs, or a combination of both. As shown in FIG. 1, the pipelined ADC circuit 100 comprises a plurality of stages 101a-n (generally, "the stage 101," collectively, "the stages 101"). In various embodiments, each stage 101 may comprise the same hardware design, while in other embodiments one or more stages 101 may include one or more additional components without going beyond the scope of the present disclosure. The stages 101 are configured to form a pipeline, where the output of the first stage is the input of the second, the output of the second is the input of the third, etc. The first stage 101a can be configured to receive an analog signal 102 from an receiver analog front end, or another source of analog signals. In some embodiments, the analog signal 102 may be a sample of a main analog signal input into an ADC device comprising the pipelined ADC circuit 100. The technology disclosed herein is applicable for a variety of applications. In some embodiments, the front end can be driven on-chip using a buffer, while in other embodiments the ADC circuit 100 can be driven off-chip from an external signal source using a termination resistor at the input of the ADC circuit 100 for impedance matching. In some embodiments, the ADC circuit 100 can serve as the main ADC device, while in other embodiments the ADC circuit 100 can be implemented as one or more sub-ADC circuits within a sub-sampling ADC architecture.

The pipelined ADC circuit 100 can have a specific resolution depending on the number and type of stages 101 included. Resolution refers to the number of bits the pipelined ADC circuit 100 uses to digitize the input analog signal 102, and determines the level of precision possible for a given conversion. As a non-limiting example, the pipelined ADC circuit 100 may have an 8-bit resolution. In various embodiments, the 8-bit resolution can be realized by including eight stages 101 in the pipelined ADC circuit 100, each stage 101 configured with 1-bit of resolution. In such an embodiment, the first stage 101a would resolve the most significant bit (MSB) of the analog signal, and the least significant bit (LSB) would be resolved by the eighth stage 101h. In some embodiments, the number of stages 101 included in the pipelined ADC circuit 100 may be equal to the number of bits of resolution for the pipelined ADC circuit 100. In various embodiments, the number of stages 101 included may be more or less than the number of bits of resolution for the pipelined ADC circuit 100. Including more stages 101 than the bit resolution level may enable error correction due to fluctuations in the pipelined ADC circuit 100.

In various embodiments, the pipelined ADC circuit 100 can be implemented in as sub-2 radix redundancy system. In the general binary weighted search algorithm, the radix used can be equal to two for each bit. In such systems, there is no redundancy built into the system, meaning that each bit is resolved in an equal number of steps. As a non-limiting example, in a radix 2 system the search algorithm would resolve four bits using four steps. If an error occurs, the result at the last step will be wrong, regardless of when the error occurred in the quantization process. To overcome this issue, a sub-2 radix can be implemented, wherein the radix is set for a value below two (e.g., radix=1.7, radix=1.9, etc.). In this manner, one or more additional stages may be included in the pipelined ADC circuit 100 of FIG. 1 to provide some redundancy in the system. With the additional stage included, multiple bit patterns can lead to an approximation within an error bound. This means that even if an error occurs during the quantization process, the result might still arrive at the correct determination. A mapping can be added to map one or more branches of the decision tree to the same digitized value. In such embodiments, more stages 101 are required to resolve a smaller number of bits. As an example, in a sub-2 radix pipelined ADC circuit 100, to resolve 8 bits at least nine stages 101 will be required. This built in redundancy reduces the possibility of an output error occurring.

Referring to FIG. 1, as stated above, the first stage 101a is configured to receive the input analog signal 102 and resolve the MSB of the analog signal 102. After resolving the MSB, the first stage 101a is configured to output the residual analog signal 103-1, which serves as the input to the second stage 101b. Each stage 101 continues to output residual analog signals 103, with the last residual analog signal 103-(n-1) serving as the input signal to the final stage 101n. The residual analog signal 103 comprises the left over quantization error that remains after the stage 101 has resolved its associated bit of the expected output value at the bit resolution of the pipelined ADC circuit 100. In addition to outputting the residual analog signals 103 along the pipeline like an assembly line, each stage 101 is also configured to output the resolved digital bit 104-1 to 104-n (generally, "the resolved digital bit 104," collectively, "the resolved digital bits 104") for the analog signal 102.

In various embodiments, the resolved digital bits 104 determined for each stage 101 may be outputted to alignment circuitry 105. The alignment circuitry 105 can be configured to align the resolved digital bits 104 from each of the stages 101 to generate a single output digitized signal 106 for each analog signal 102 that traverses the pipelined ADC circuit 100. Each stage 101 will resolve the bit position for the bit resolution of the pipelined ADC circuit 100 sequentially, meaning that the previous stage 101 will resolve its responsible digital bit before the following stage 101. The alignment circuitry 105 can be configured to delay the resolved digital bit 104 for the earlier stages 101 a number of conversion cycles necessary for the analog signal 102 to be fully digitized (i.e., reaches the end of the pipelined ADC circuit 100). One or more flip-flop circuits can be configured to delay the resolved digital bit 104 of each stage to align all of the resolved digital bits 104 for a given analog signal 102 in time. In various embodiments, the output digitized signal 106 can be sent to one or more processing circuits within the ADC device and/or of a device in which the ADC device (and, therefore, the pipelined ADC circuit 100) is implemented.

Figure 2A:
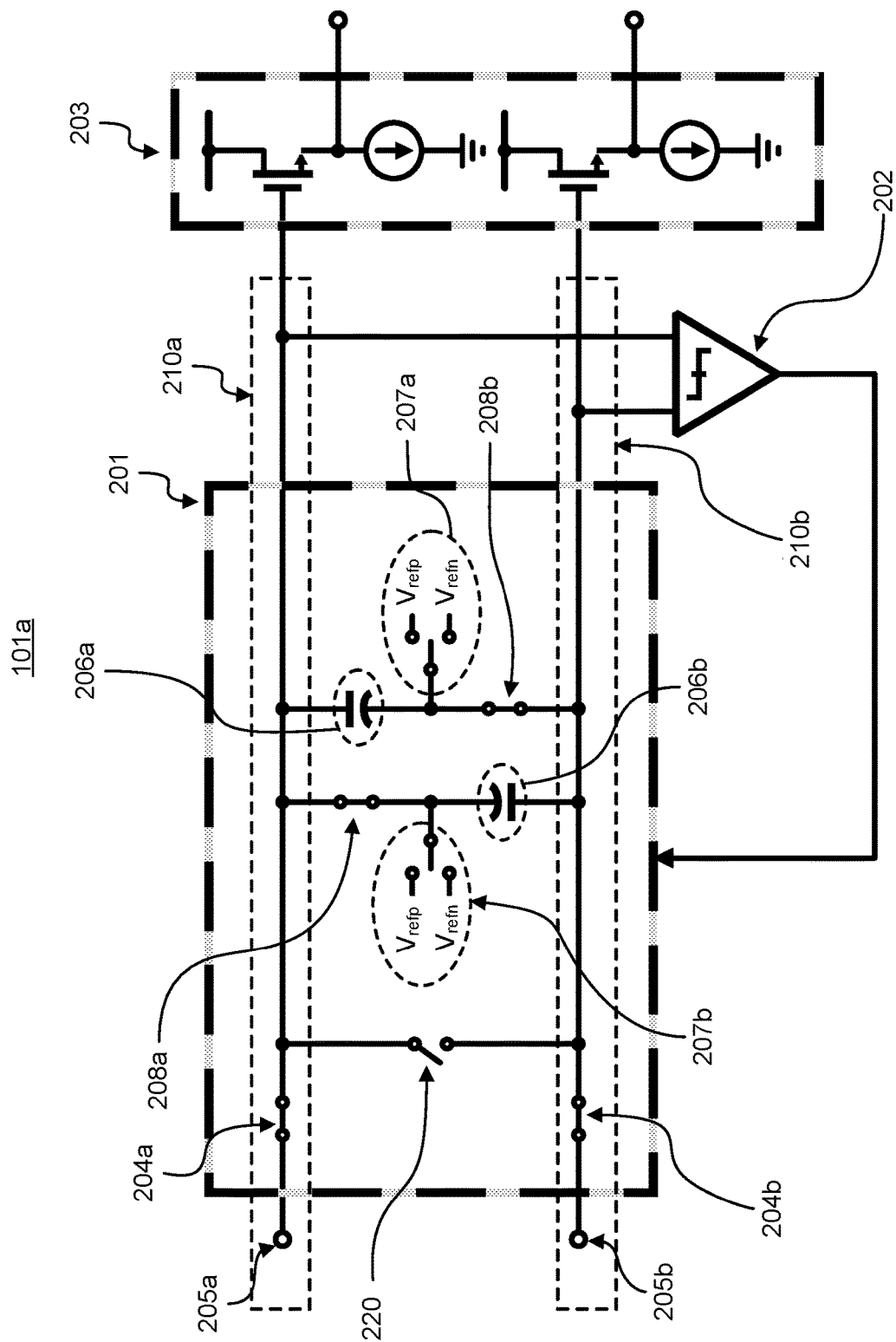
FIG. 2A shows an example stage of the pipelined ADC circuit of FIG. 1 during a sampling operation in accordance with embodiments of the technology disclosed herein.

FIGS. 2A-2E illustrate an example stage 101a of the pipelined ADC circuit 100 discussed with respect to FIG. 1. The example stage 101a is provided for illustrative purposes only and should not be interpreted as limiting the scope of the technology to only the depicted embodiment. In various embodiments, the design discussed with respect to the stage 101a of FIGS. 2A-2E can be implemented as one or more of the other stages 101 within the pipelined ADC circuit 100 of FIG. 1. As shown in FIG. 2A, in various embodiments the stage 101a can comprise an MDAC 201, a comparator 202, and a buffer 203. Additional electrical traces and/or components common for electrical circuitry may be omitted from the example stage 101a depicted in FIGS. 2A-2E for ease of discussion, and a person of ordinary skill would understand how to implement such common circuitry. Such omissions do not impact the ability of a person of ordinary skill in the art to fully comprehend and understand how to implement the technology disclosed herein.

For ease of discussion, when referring to differential signals the inverted signal shall be referred to as the "negative input signal" and the non-inverted signal shall be referred to as the "positive input signal." In various embodiments, the stage 101a can comprise a pair of differential paths, a positive input signal path 210a and a negative input signal path 210b. The voltages on each of the differential paths 210 represent the input voltage $V_{in}$ for the sampled analog signal. In various embodiments, a set of differential input switches 204a, 204b (generally, "the differential input switch 204," collectively, "the differential input switches 204") having a first terminal connected to a respective input node 205a, 205b (generally, "the input node 205," collectively, "the input nodes 205"). The input nodes 205 may comprise a connection point between the stage 101a and an input trace of the pipelined ADC circuit 100 in some embodiments, and in some embodiments the input nodes 205 may comprise a section of wire between the stage 101a and one or more circuit elements of the front end providing the analog signal 102 to the pipelined ADC circuit 100. In various embodiments, a second terminal of each differential input switch 204 is configured to connect to a first terminal of a capacitor switch 208a, 208b (generally, "the capacitor switch 208," collectively, "the capacitor switches 208"). In the present disclosure, it should be understood that the connection of terminals of different elements can either be direct or through a node, and that a node can comprise a single point or an entire section of wire between terminals, as is commonly understood within the art.

Each capacitor switch 208 can be configured to connect and disconnect the differential signal paths 210a, 210b from a respective capacitor 206a, 206b (generally, "the capacitor 206," collectively, "the capacitors 206") of the MDAC 201. In various embodiments, the capacitor 206a can be configured to store the sampled positive input signal and the capacitor 206b can be configured to store the sampled negative input signal. A second terminal of each capacitor switch 208a, 208b can be connected to a first plate of each capacitor 206b, 206a, respectively. The second plate of each capacitor 206b, 206a can be connected to the positive input signal path 210b or the negative input signal path 210a, respectively. Also connected to the first plate of each capacitor 206 can be a reference voltage switch 207a, 207b (generally, "the reference voltage switch 207," collectively, "the reference voltage switches 207"). Each of the reference voltage switches 207 can be configured to connect either a positive reference voltage $V_{refp}$, a negative reference voltage $V_{refn}$, or no reference voltage to the first plate (i.e., the curved plate) of each capacitor 206. In this manner, a stored value of either capacitor 206 can be driven (i.e., output) based on the application of either of the reference voltages $V_{ref}$. In various embodiments, the capacitors 206 can comprise a metal-oxide-metal (MOM) capacitor. In some embodiments, the first plate of each capacitor 206 can have more capacitance than the second plate.

As shown in FIG. 2A, the stage 101a can first sample the analog signal (on the positive input signal path 210a and the negative input signal path 210b to charge the capacitors 206. The differential signal will be stored on the capacitors 206. In various embodiments, during sampling the differential input switches 204 are set to the closed position, thereby allowing the differential input signals to enter the stage 101a over the positive input signal path 210a and the negative input signal path 210b, and the capacitor switches 208 are set to the closed position to connect the first plate of each capacitor to the respective differential path 210. Due to the plates of each capacitor 206 being connected to a different differential path 210, the differential signal is stored on the capacitors 206.

In various embodiments, the sampling period may comprise one or more clock cycles, while in some embodiments the sampling period may comprise a portion of a clock cycle. FIG. 3 provides an example timing diagram 300 in accordance with embodiments of the technology disclosed herein. The example timing diagram 300 is provided for illustrative purposes only and should not be interpreted as limiting the scope of the technology to only the depicted timing diagram. The example timing diagram 300 may be implemented for the pipelined ADC circuit 100 and the example stages 101 discussed with respect to FIGS. 1 and 2A-2E. The bolded operations represent the same analog signal (e.g., analog signal 102) as it traverses each stage. As shown in FIG. 3, the clock signal clk is the same for each stage of the pipelined ADC circuit 100. For ease of reference, the example timing diagram 300 shows the timing from the perspective of two stages, 101a and 101b. In various embodiments the same or similar timing approach can be utilized for the other stages 101 of a pipelined ADC circuit 100 of FIG. 1. During a first clock cycle CLK-1, 101a can perform two actions in various embodiments, a reset operation (discussed in greater detail with respect to FIG. 2E) and a sample operation. As shown in FIG. 1, the sample operation is not as long as the first clock cycle CLK-1. During the sample operation, the differential input switches 204 and the capacitor switches 208 are in the closed position, similar to the discussion of sampling with respect to FIG. 2A. As shown in FIG. 3, the sampling operation would occur within a single cycle of the clock CLK. In other embodiments, the sampling operation may occur over more than one cycle of the clock CLK.

Figure 2B:
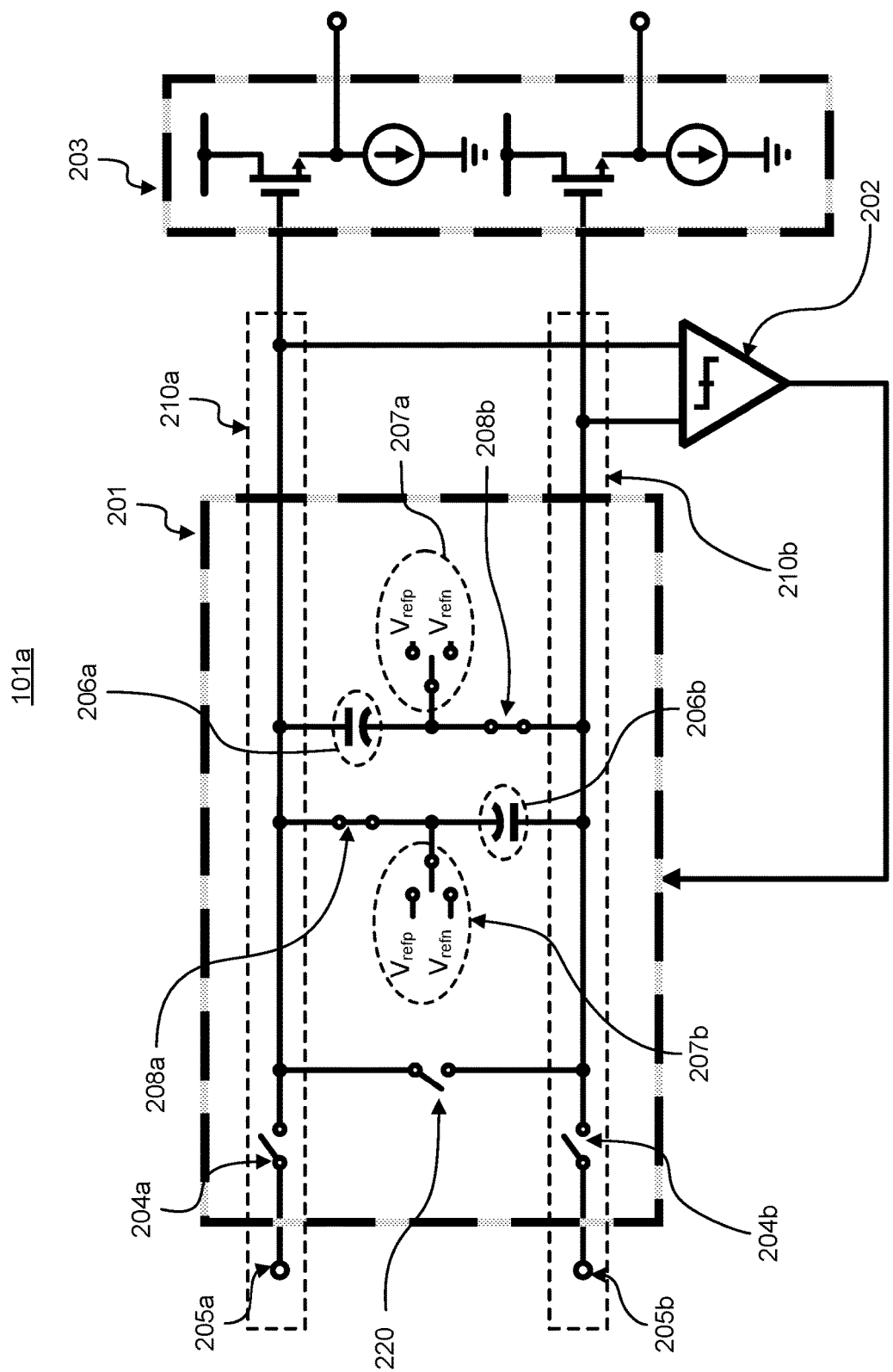
FIG. 2B shows the example stage of the pipelined ADC circuit of FIG. 1 during a comparison operation in accordance with embodiments of the technology disclosed herein.
Figure 3:
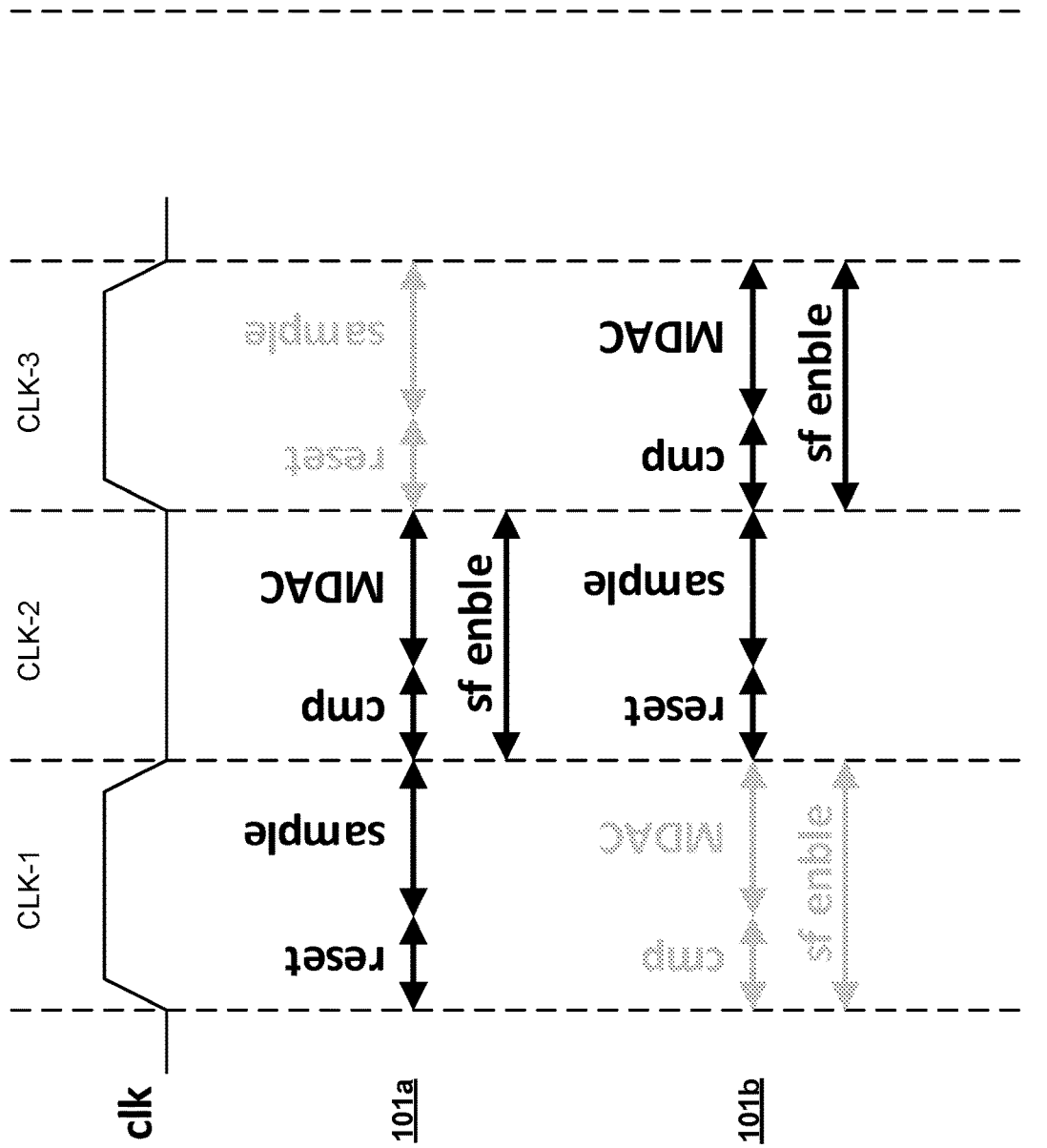
FIG. 3 is an example timing diagram in accordance with embodiments of the technology disclosed herein.

Referring to FIG. 2B, each of the differential input paths 210 are connected to a different input terminal of a comparator 202. In various embodiments, the positive input signal path 210a may be connected to a first input terminal of the comparator 202 and the negative input signal path 210b may be connected to a second input terminal of the comparator 202. The comparator 202 can be configured to compare the analog signals on each path to each other to determine whether the analog signal 102 is closer to a positive reference voltage $V_{refp}$ or a negative reference voltage $V_{refn}$ for the system (i.e., the input voltage $V_{in}$ of the analog signal 102 is either positive or negative). In various embodiments, the comparator 202 may comprise a high-gain differential amplifier, an operational amplifier, or other comparator circuitry known in the art. As shown in FIG. 3, the comparator operation cmp can be triggered at the start of the second clock cycle CLK-2. The length of the comparison operation cmp can be performed for a time equal to or less than half the second clock cycle CLK-2 in some embodiments, while in other embodiments the comparison operation cmp can be performed for a time equal to or greater than half the second clock cycle CLK-2.

Referring back to FIG. 2B, at the beginning of the second clock cycle CLK-2 the differential input switches 204 can be set to the open position to cease the sampling operation and disconnect the stage 101a from the input of the pipelined ADC circuit 100, thereby triggering the comparator 202 to compare the voltage on the positive input signal path 210a and the negative input signal path 210b. Therefore, the sampled differential signal observed during the clock cycle becomes the first signal portion to be digitized in the pipelined ADC circuit 100. Through sampling, the input analog signal 102 is broken up into sampled portions, each of which is to be digitized to a digital output with the bit resolution of the pipelined ADC circuit 100.

As stated above, the comparator 202 compares the voltages of the differential signals and determines whether the differential voltage is a positive voltage or a negative voltage. In various embodiments, the comparator 202 can comprise a positive output line and a negative output line (not shown in FIG. 2B), both initially starting at a logic low value. The differential output signal (the positive output line and the negative output line) is illustrated as a single output from the comparator 202 in the depicted embodiment. When both the positive output line and the negative output line are at logic low, the reference voltage switches 207 remain in an open position, wherein neither the positive reference voltage nor the negative reference voltage is connected to the first (bottom) plates of the capacitors 206. In various embodiments, if the comparison determines the input voltage $V_{in}$ is positive, the positive output line can be set to a logic high while the negative output line remains at a logic low, while a determination it is negative results in the negative output line being set to a logic high while the positive output line remains at a logic low. Based on the asserted logic high signal, either the positive reference voltage or the negative reference voltage is applied to the first plate of each capacitor 206 (as discussed in greater detail with respect to FIGS. 2C and 2D). In other embodiments, the reverse mapping may be applied. The output voltage signal on either the positive output line or the negative output line represents the residual error signal resulting quantization performed by the comparator 202.

The stage 101a is configured to generate a gained residual analog signal to serve as the input signal for the next stage in the pipeline. In various embodiments, the MDAC 201 utilizes passive multiplication to generate the gained residual analog signal to serve as the DC operation point for the buffer 203. As discussed above, the capacitors 206 store the sampled differential signal during the sampling operation in the first clock cycle CLK-1. Depending on the determination by the comparator 202, the capacitors 206 are connected in series and an appropriate reference voltage is applied. When the reference voltage is applied to the first plate of each capacitor 206, the voltage at the second plate is pushed to the residual voltage level (i.e., the input differential signal voltage plus the applied reference voltage). Depending on the type of reference voltage applied (either positive or negative), the resulting differential signal comprising the residual analog signal is pushed with closer to the positive reference voltage or the negative reference voltage. By stacking the capacitor voltage, the output from the MDAC 201 is equivalent to:

$$2V_{in\_diff} \pm V_{ref\_diff} \quad (1)$$

where the $2V_{in\_diff}$ represents the sampled differential signal stored in the capacitors 206 and $V_{ref\_diff}$ is the differential reference voltage signal applied to the first plate of both capacitors based on the comparator 202 output. The switching operation (i.e., applying the reference voltages to the capacitors 206) is configured to provide the new DC operation point for the buffer 203. When the reference switches 207 are triggered, the sampled signal stored on the capacitors 206 is added or subtracted by $$V_{ref\_diff} = V_{refp} - V_{refn}. \quad (2)$$

In various embodiments, the output from the MDAC 201 is driven to the next stage in the pipeline through the use of a buffer 203. In the depicted embodiment, the buffer 203 comprises a source follower including a set of field effect transistors (FETs) 212a, 212b (generally, "the FETs 212," collectively, "the FETs 212"). It should be understood that FETs 212 can refer to N-FETs as they form a source follower buffer. The multiplied output from the MDAC 201 on the positive input signal path 210a and the negative input signal path 210b serves as the gate voltage for each FET 212a, 212b, respectively, of the buffer 203. A common drain voltage $V_{dd}$ is applied to the drain terminal of each FET 212, and a current source 213a, 213b are connected to the source terminal of each FET 212a, 212b, respectively. The buffer 203 serves to drive the amplified residual signal into the next stage. In some embodiments, a switch can be connected in series with the current sources 213 to enable the current sources 213 to be turned off in between sampling periods. When the amplified residual analog signals are applied to each of the gate terminals of the FETs 212 the amplified residual analog signals are driven onto an output node 214a, 214b (generally, "the output node 214," collectively, "the output nodes 214"), which may be connected to the input nodes of the following stage in the pipeline. In some embodiments, one or more capacitors may be connected to each of the differential paths 210 and disposed between the MDAC 201 and the buffer 203.

Figure 2C:
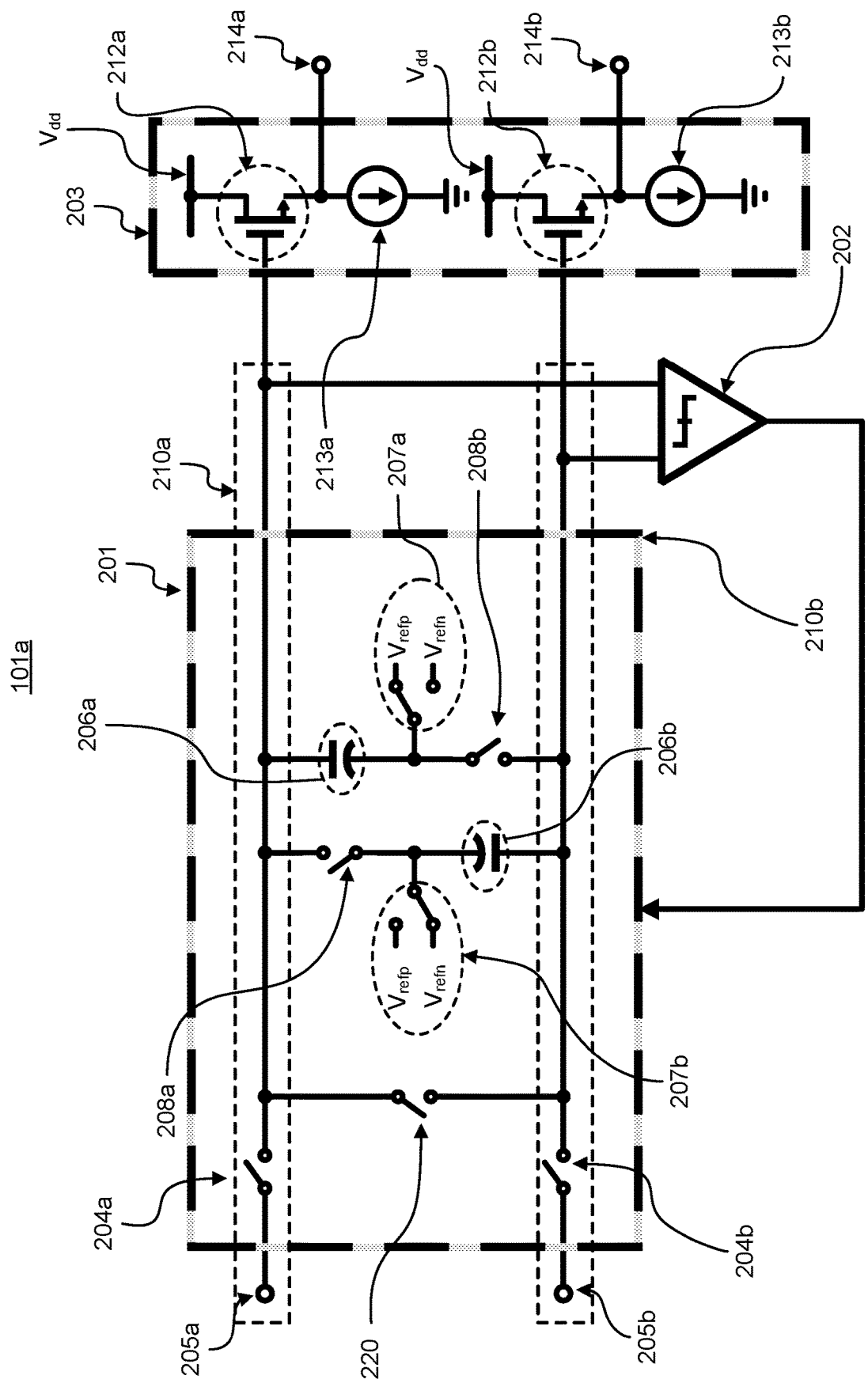
FIG. 2C shows an example stage of the pipelined ADC circuit of FIG. 1 during a positive amplification operation in accordance with embodiments of the technology disclosed herein.
Figure 2D:
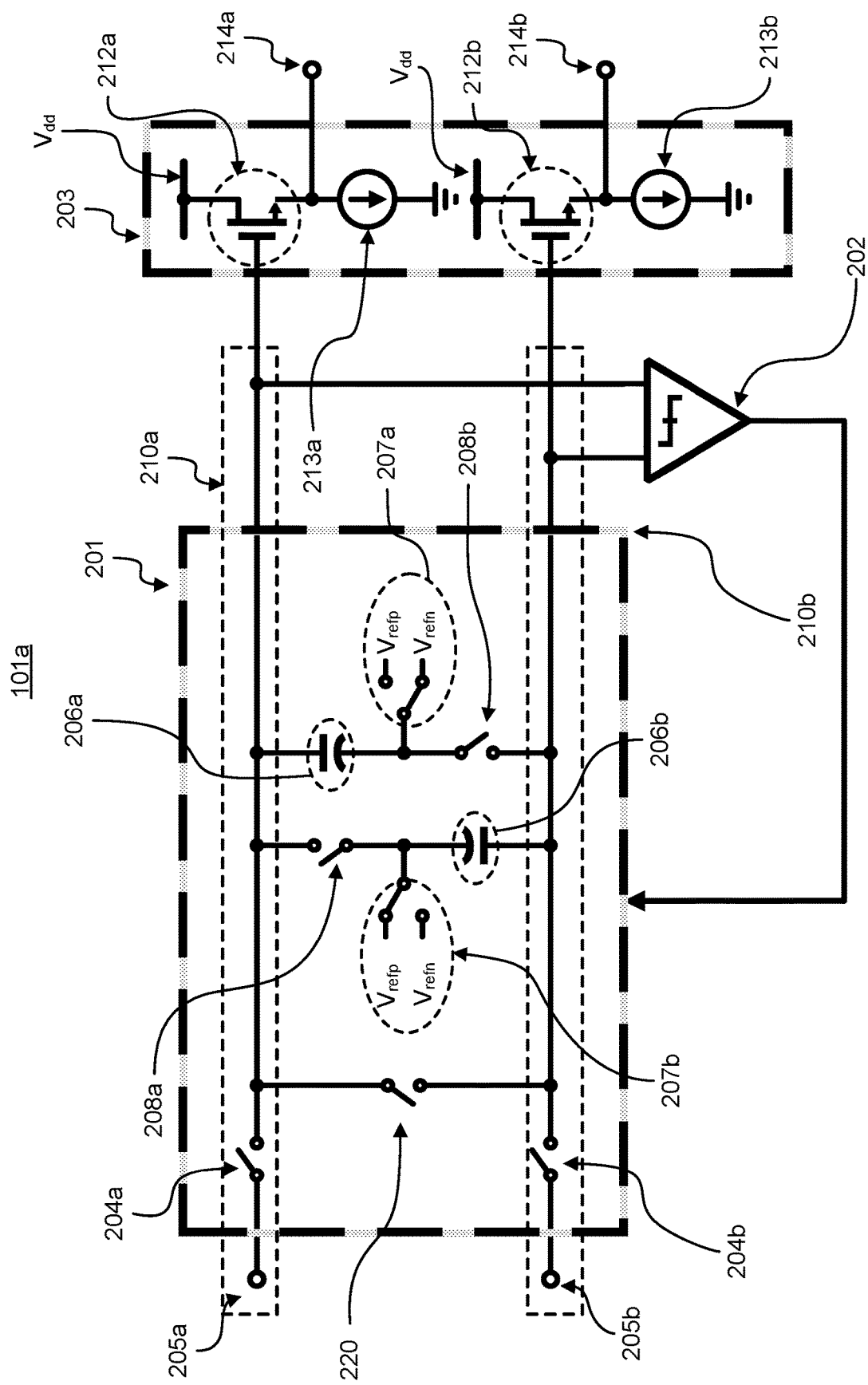
FIG. 2D shows an example stage of the pipelined ADC circuit of FIG. 1 during a negative amplification operation in accordance with embodiments of the technology disclosed herein.

FIGS. 2C and 2D illustrate an example amplification by the MDAC 201 in accordance with the technology disclosed herein, and are provided for illustrative purposes only. In FIG. 2C, the MDAC 201 is triggered to perform a positive offset because the comparator 202 determined the input voltage $V_{in}$ was negative. Therefore, the positive differential reference voltage is applied to the first plate of the capacitors 206, with the positive reference voltage $V_{refp}$ is applied to the first plate of the positive input signal capacitor 206a and the negative reference voltage $V_{refn}$ is applied to the first plate of the negative input signal capacitor 206b. In various embodiments, the comparator 202 can trigger the capacitor switches 208 and the reference voltage switches 207 to switch position. In various embodiments, the comparator 202 may trigger the switches based on whether the positive output line or the negative output line is at a logic high, while in other embodiments the comparator 202 may generate a control signal that triggers the switches. With respect to the capacitor switches 208, the comparator 202 can open the capacitor switches 208 to break the connection between the first plate of the capacitors 206 and the positive input signal path 210a and the negative input signal path 210b. The reference voltage switch 207 can be switched to apply an opposite voltage polarity to the first plate of each capacitor 206, applying an opposite voltage polarity to the negative input voltage $V_{in}$. FIG. 2D illustrates the opposite result (where the comparator 202 determines the input voltage $V_{in}$ is positive). In such embodiments, the comparator 202 can trigger the reference voltage switch 207 to apply the a negative differential reference voltage to the first plates of the capacitors 206 by applying positive reference voltage $V_{refp}$ is applied to the first plate of the negative input signal capacitor 206b and the negative reference voltage $V_{refn}$ is applied to the first plate of the positive input signal capacitor 206a.

As shown in FIG. 3, the comparator operation cmp and the MDAC operation can be performed within a single clock cycle (here, the second clock cycle CLK-2). In various embodiments, the operations can both be performed in the same time, while in other embodiments one of the operations may have a time of performance longer than the other. As shown in the example timing diagram of FIG. 3, the comparator operation cmp has a shorter performance time than the MDAC operation. While the first stage 101a is performing the comparator operation cmp and the MDAC operation the second stage 101b can perform a sampling operation similar to the sampling operation discussed with respect to FIGS. 2A and 3. During the second clock cycle CLK-2, the second stage 101b is sampling the amplified residual analog signal from the first stage 101a, such as the residual analog signal 103-1 discussed with respect to FIG. 1.

Figure 4:
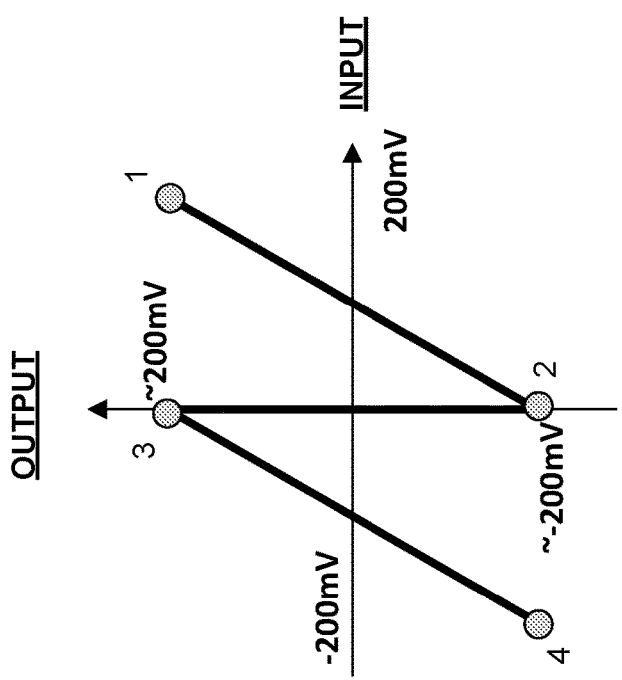
FIG. 4A is an example residue plot in accordance with embodiments of the technology disclosed herein.
FIG. 4B shows an example of the capacitor voltages during the sampling operation in accordance with embodiments disclosed herein.

FIGS. 4A and 4B provides an example operation of the residue function performed by the MDAC 201 in accordance with the technology of the present disclosure. The values used in the example of FIGS. 4A and 4B are for ease of discussion and do not represent any limit on the specific values or units of measure applicable to the technology. The technology is not limited only to the operational parameters in the example of FIGS. 4A and 4B, and are provided solely for ease of discussion. The example of FIG. 4A shows an example residue plot for a stage like that discussed with respect to FIGS. 1-3. Four points along the residue plot (Point 1, Point 2, Point 3, Point 4) are identified to assist in describing that result of the stages 101 discussed with respect to FIGS. 1-3. FIG. 4B shows an example of what the capacitor voltages look like during the sampling operation at each Point of FIG. 4A (in the left column) and the resulting voltage following the MDAC operation for each Point (in the right column).

As shown in FIG. 4A, Point 1 represents a high positive input voltage (in the illustrated example, 200 mV). In such embodiments, the voltage across each capacitor 206 would be the same or near the high positive input voltage. Referring to FIG. 4B, during the sampling operation the capacitors 206 would both store a +200 mV signal. Following the MDAC operation described with respect to FIGS. 2A-2B and 3, the output voltage would be +200 mV. Because the comparator 202 would have determined the input voltage was positive, a negative reference voltage would be applied to the capacitors. Using the equation discussed above, the total input voltage stored in the capacitors 206 would be +400 mV, and the −200 mV serves as the negative reference voltage. Accordingly, the result is an output voltage of +200 mV. Point 2 represents a small positive input voltage (effectively +0 V for the purposes of the example of FIGS. 4A, 4B), resulting in roughly +0 V being stored on the capacitors 206. Although small, the comparator 202 would still determine the input signal to be positive, and therefore would apply the negative reference voltage (here, −200 mV). Because the voltage stored across the capacitors is small, the MDAC result would mostly be the negative reference voltage. Points 3 and 4 are similar to Points 1 and 2, respectively, except in the negative input voltage range. Accordingly, rather than applying a negative reference voltage, a positive reference voltage is applied (here, a +200 mV reference voltage).

Figure 2E:
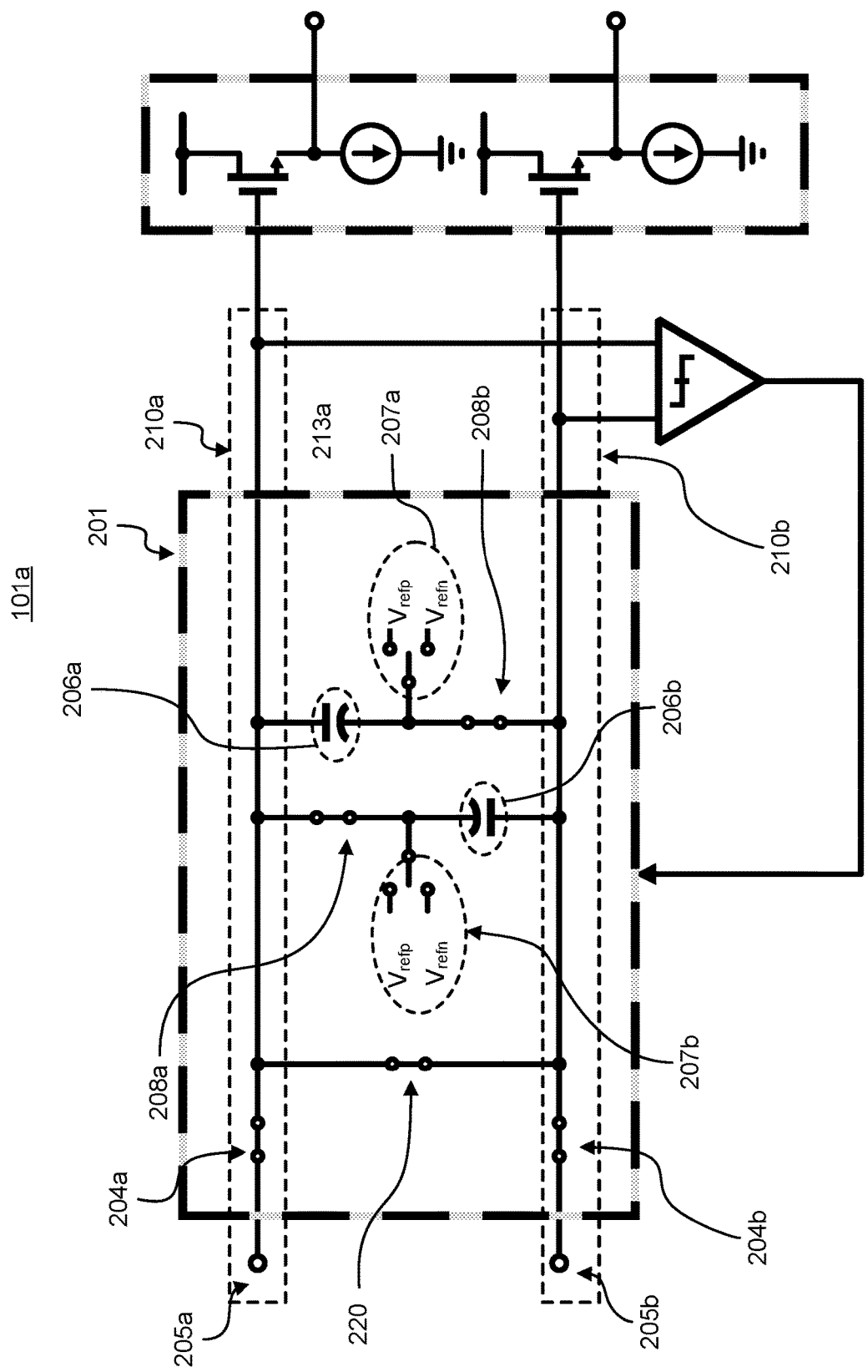
FIG. 2E shows an example stage of the pipelined ADC circuit of FIG. 1 during a reset operation in accordance with embodiments of the technology disclosed herein.

In various embodiments, some residual voltage may leak back into a stage from the buffer 203. In such embodiments, a reset switch 220 may be used to remove any excess signals associated with the previous sample. As shown in FIGS. 2A-2D, during operation of the stage 101a to resolve the digitized bit, the reset switch 220 can be in the open position. To reset the switch in preparation for the next sample, the reset switch 220 can be closed, connecting both differential paths 210 together, as shown in FIG. 2E. As shown in FIG. 3, the second stage 101b can first perform a reset operation at the beginning of the second clock cycle CLK-2 to clear any residual signals in the second stage 101b components. In various embodiments, the reset operation may have a performance time less than or equal to the performance time of the sampling operation. In some embodiments, one or more additional operations may be included to normalize each stage 101 prior to the next sampling period.

In some embodiments, to save power the buffer 203 may be "ON" during every other clock cycle. As shown in FIG. 3, the buffer 203 of the first stage 101a can turn ON at the start of the second clock cycle CLK-2, and turn OFF at the start of the third clock cycle CLK-3. In the illustrated embodiment, the buffer 203 is a source follower, and the operating time of the source follower is indicated by sf enable. In a similar manner, the buffer 203 of the second stage 101b can be active (i.e., turned ON and OFF) only during the clock cycle within which the comparator operation cmp and the MDAC operation occur. In other embodiments, the buffer 203 may always be in the ON state.

Figure 5:
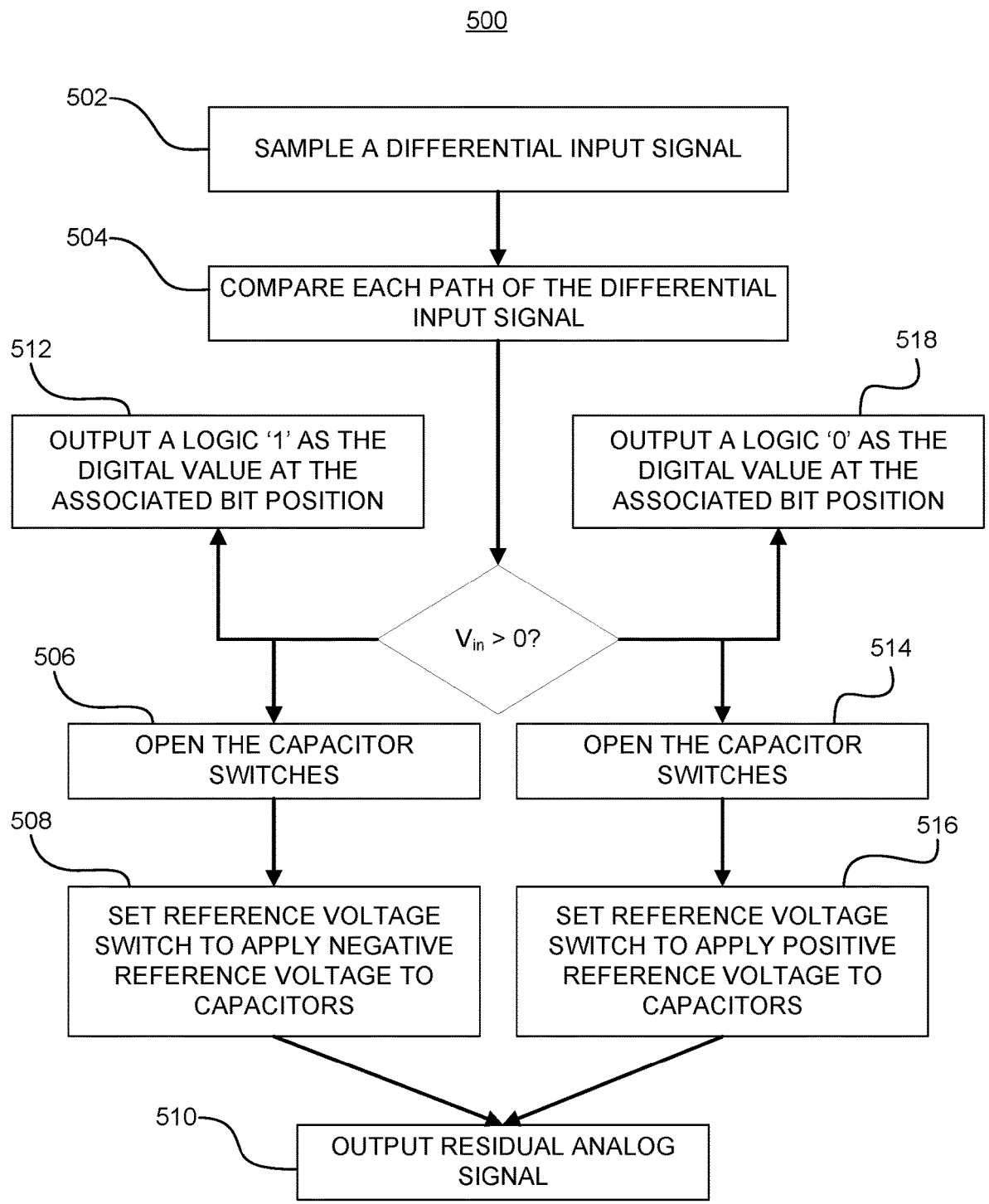
FIG. 5 illustrates an example method in accordance with embodiments of the technology disclosed herein.

FIG. 5 illustrates an example method 500 in accordance with embodiments of the technology disclosed herein. The method 500 is provided for illustrative purposes only and should not be interpreted as limiting the scope of the technology to only the depicted method 500. One or more additional operations may be included without going beyond the scope of the example method 500. In various embodiments, the method 500 may be implemented in hardware circuitry, including capacitors, resistors, chips, flip-flops, inductors, electrical traces, and other elements used to generate circuits on a printed circuit board (PCB). In various embodiments, the method 500 may be implemented in one or more of hardware, firmware, software, or a combination thereof. In various embodiments, the method 500 can be performed by each stage of a pipelined ADC circuit like the stages 101 discussed with respect to FIGS. 1-4.

At operation 502, an differential input analog signal is sampled. In various embodiments, each differential signal (i.e., the positive and negative input signals) of the differential input analog signal may comprise a time-interleaved or non-time-interleaved analog signal received from one or more elements of a front end circuit of an ADC device, similar to the first stage 101a discussed above with respect to FIGS. 1-4. In other embodiments, the input differential analog signal may comprise an amplified residual analog signal received from a previous stage within a pipelined ADC circuit of an ADC device. Sampling the differential input analog signal may comprise setting one or more differential switches and one or more capacitor switches to a closed position, similar to the switches discussed with respect to FIG. 2A above.

At operation 504, each path of the sampled differential input signal is compared. The sampled differential input analog signal comprises the original signal and an inverted version of that original signal. Comparing the two signals of the differential pair may comprise determining whether the voltage of the analog input signal is positive or negative. In various embodiments, the comparison may be performed by a comparator, with the positive input signal path connected to a first input terminal of the comparator, and the negative input signal path connected to a second input terminal, similar to the discussion above with respect to FIGS. 2B-2E. If the input voltage (based on the difference between the differential pair) is determined to be greater than zero (i.e., is positive), each of the capacitor switches can be opened at operation 506. Opening the capacitor switches can comprise setting each capacitor switch to an open state, disconnecting a first plate of each capacitor from a respective electrical path for each differential signal, such as the positive input signal path 210a and the negative input signal path 210b discussed above with respect to FIGS. 2C-2E. After opening the capacitor switches, a negative reference voltage can be applied to each of the first plates of the capacitors at operation 508. Applying the negative reference voltage is configure to push the positive-voltage differential input analog signal closer to zero volts. In various embodiments, the negative reference voltage may be equal to a maximum negative voltage signal of the pipelined ADC circuit, while in other embodiments the negative reference voltage can comprise a negative voltage between a maximum negative voltage and zero voltage. The differential value of the reference voltage controls the full-scale range of the ADC application in which the ADC circuit 100 is implemented. The common-mode value of the reference voltage is constrained at the upper end by needing to keep the buffer 203 in saturation and by the break-down limits of the reference switches 207. The common-mode value is constrained at the lower end by needing to keep the current source of the buffer 203 in saturation because the reference voltage controls the buffer input common-mode and therefore its output common-mode. At operation 510, the amplified residual analog signal can be output. Through stacking of the capacitor voltages stored in the capacitors discussed with respect to operation 502, the residual analog signal is amplified through passive multiplication. In various embodiments, outputting the residual analog signal can be output using a buffer circuit to drive the output to a next stage in the pipelined ADC circuit.

If the input voltage was determined to be positive, a logic '1' may be output as the digital value for the associated bit position of the respective stage at operation 512. Each stage within the pipelined ADC circuit is configured to resolve the digitized bit value for a respective bit position of an output digital representation of the sampled differential input signal. The number of bit positions can be determined based on the bit resolution of the pipelined ADC circuit. In various embodiments, a logic '0' may be output at operation 512, depending on the mapping utilized in a given environment.

If the input voltage is determined to be negative, the capacitor switches can be opened at operation 514, which is similar to the operation 506 discussed with respect to a positive input signal. After opening the capacitor switches, the reference voltage switch can be set to apply a positive reference to the capacitors at operation 516. Applying the positive reference voltage is configure to push the negative-voltage differential input analog signal closer to zero volts. In various embodiments, the positive reference voltage may be equal to a maximum positive voltage signal of the pipelined ADC circuit, while in other embodiments the positive reference voltage can comprise a positive voltage between a maximum negative voltage and zero voltage. The method 500 can then move to operation 510 to output the residual signal in a similar manner as the other decision branch.

If the input voltage was determined to be negative, a logic '0' may be output as the digital value for the associated bit position of the respective stage at operation 518. Each stage within the pipelined ADC circuit is configured to resolve the digitized bit value for a respective bit position of an output digital representation of the sampled differential input signal. The number of bit positions can be determined based on the bit resolution of the pipelined ADC circuit. In various embodiments, a logic '1' may be output at operation 518, depending on the mapping utilized in a given environment.

In general, the word "component," "engine," "system," "database," "data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An analog-to-digital converter (ADC) sub-circuit stage comprising:
    a differential input configured to receive a differential signal comprising a positive voltage signal on a first path and a negative voltage signal on a second path;
    a multiplying digital-to-analog converter (MDAC) electrically coupled to the differential input configured to stack voltages of a set of capacitors;
    a comparator electrically coupled to the first path and the second path and electrically disposed after the MDAC, a first input of the comparator connected to the first path and a second input of the comparator connected to the second path; and
    a source follower buffer electrically coupled to the first path and the second path and electrically disposed after the comparator,
    wherein the MDAC is configured to amplify an output voltage using passive multiplication.

2. The ADC sub-circuit stage of claim 1, further comprising a set of differential switches, a first differential switch connected to the first path and a second differential switch connected to the second path.

3. The ADC sub-circuit stage of claim 1, the MDAC further comprising:
    a positive capacitor switch having a first terminal connected to the first path and a second terminal connected to a first plate of a first capacitor of the set of capacitors; and
    a negative capacitor switch having a first terminal connected to the second path and a second terminal connected to a first plate of a second capacitor of the set of capacitors,
    wherein the positive capacitor switch and the negative capacitor switch are configured to store a sample of the differential signal.

4. The ADC sub-circuit stage of claim 3, wherein the positive capacitor switch and the negative capacitor switch are set to a closed position during a sampling operation.

5. The ADC sub-circuit stage of claim 1, the comparator configured to output a digitized bit based on a comparison of the positive input voltage and the negative input voltage.

6. The ADC sub-circuit stage of claim 5, in response to determining a voltage of the differential signal is positive, applying a negative reference voltage to a first plate of the set of capacitors.

7. The ADC sub-circuit stage of claim 5, in response to determining a voltage of the differential signal is negative, applying a positive reference voltage to a first plate of the set of capacitors.

8. The ADC sub-circuit stage of claim 5, wherein the set of capacitors are connected in series after the comparison of the positive input voltage and the negative input voltage, and a common voltage reference signal is applied to each capacitor of the set of capacitors.

9. The ADC sub-circuit stage of claim 1, wherein the source follower buffer comprises a source follower circuit, the source follower circuit comprising:
    a first field effect transistor (FET) having the first path connected to a gate terminal of the first FET; and
    a second FET having the second path connected to a gate of the second FET.

10. The ADC sub-circuit stage of claim 1, further comprising a reset switch having a first terminal connected to the first path and a second terminal connected to the second path.

11. The ADC sub-circuit stage of claim 1, wherein a sample operation is performed during a first clock cycle and a comparison operation is performed during a second clock cycle.

12. A method comprising:
    sampling, by an ADC sub-circuit stage, a differential input signal;
    comparing, by a comparator of the ADC sub-circuit stage, each path of the sampled differential input signal;
    if a voltage of the sampled differential input signal is determined to be positive:
        opening a set of capacitor switches;
        setting a reference voltage switch to apply a negative reference voltage to the set of capacitors;
        output a residual analog signal; and
        output a logic '1' as a digital value of an associated bit position; and
    if a voltage of the sampled differential input signal is determined to be negative:
        opening a set of capacitor switches;
        setting a reference voltage switch to apply a positive reference voltage to the set of capacitors; and
        output a residual analog signal; and
        output a logic '0' as a digital value of an associated bit position.

13. The method of claim 12, wherein sampling the differential input signal comprises storing a voltage of the differential input signal using a set of capacitors, a first capacitor configured to store a first voltage on a first path of the differential input signal and a second capacitor configured to store a second voltage on a second path of the differential input signal.

14. The method of claim 12, wherein comparing each path of the sampled differential input signal comprises determining if a difference between a voltage on a first path and a voltage on a second path.

15. A pipelined ADC circuit comprising:
a plurality of stages disposed such that an output of a previous stage is an input of a subsequent stage, each of the stages comprising:
a differential input configured to receive a differential signal comprising a positive voltage signal on a first path and a negative voltage signal on a second path;
a multiplying digital-to-analog converter (MDAC) electrically coupled to the differential input configured to stack voltages of a set of capacitors;
a comparator electrically coupled to the first path and the second path and electrically disposed after the MDAC, a first input of the comparator connected to the first path and a second input of the comparator connected to the second path; and
a source follower buffer electrically coupled to the first path and the second path and electrically disposed after the comparator,
wherein the MDAC is configured to amplify an output voltage using passive multiplication; and
an alignment circuit communicatively connected to a digital bit output of each stage of the plurality of stages, wherein the alignment circuit is configured to delay a digital bit output of each stage for one or more clock cycles and output a digitized representation of a sampled differential signal.

16. The pipelined ADC circuit of claim 15, the comparator configured to output a digitized bit based on a comparison of the positive input voltage and the negative input voltage.

17. The pipelined ADC circuit of claim 16, in response to determining a voltage of the differential signal is positive, applying a negative reference voltage to a first plate of the set of capacitors.

18. The pipelined ADC circuit of claim 16, in response to determining a voltage of the differential signal is negative, applying a positive reference voltage to a first plate of the set of capacitors.

19. The pipelined ADC circuit of claim 16, wherein the set of capacitors are connected in series after the comparison of the positive input voltage and the negative input voltage, and a common voltage reference signal is applied to each capacitor of the set of capacitors.

20. The pipelined ADC circuit of claim 15, wherein the number of stages of the plurality of stages is larger than a number of bits comprising a bit resolution of the pipelined ADC circuit.

* * * * *